(12) United States Patent
Chu

(10) Patent No.: US 7,332,387 B2
(45) Date of Patent: Feb. 19, 2008

(54) MOSFET STRUCTURE AND METHOD OF FABRICATING THE SAME

(75) Inventor: Chen-Liang Chu, Hsinchu (TW)

(73) Assignee: Promos Technologies Inc., Hsinchu (TW)

(*) Notice: Subject to any disclaimer, the term of this patent is extended or adjusted under 35 U.S.C. 154(b) by 52 days.

(21) Appl. No.: 11/324,454

(22) Filed: Jan. 3, 2006

(65) Prior Publication Data

US 2006/0110886 A1    May 25, 2006

Related U.S. Application Data

(62) Division of application No. 10/783,258, filed on Feb. 20, 2004, now abandoned.

(30) Foreign Application Priority Data

Nov. 14, 2003   (TW) .............................. 92132072 A

(51) Int. Cl.
  H01L 21/8234    (2006.01)
(52) U.S. Cl. .................... 438/197; 438/225; 438/286; 438/294; 438/297

(58) Field of Classification Search .................. 438/197
See application file for complete search history.

(56) References Cited

U.S. PATENT DOCUMENTS

| | | | |
|---|---|---|---|
| 5,470,783 A | * | 11/1995 | Chiu et al. ............ 438/446 |
| 5,741,737 A | * | 4/1998 | Kachelmeier ............ 438/286 |
| 2005/0116293 A1 | * | 6/2005 | Goldbach et al. ......... 257/349 |

FOREIGN PATENT DOCUMENTS

| | | | |
|---|---|---|---|
| JP | 04-246862 | * | 9/1992 |
| JP | 04246862 | | 9/1992 |
| TW | 472387 | | 1/2002 |

* cited by examiner

*Primary Examiner*—Hsien-Ming Lee
*Assistant Examiner*—Ankush K Singal
(74) *Attorney, Agent, or Firm*—Thomas, Kayden, Horstemeyer & Risley

(57) ABSTRACT

A MOSFET structure and a method of forming it are described. The thickness of a portion of the gate dielectric layer of the MOSFET structure adjacent to the drain region is increased to form a bird's beak structure. The gate-to-drain overlap capacitance is reduced by the bird's beak structure.

11 Claims, 7 Drawing Sheets

MOSFET STRUCTURE AND METHOD OF FABRICATING THE SAME

The present application is a divisional application of U.S. patent application Ser. No. 10/783,258, filed Feb. 20, 2004 now abandoned.

BACKGROUND OF THE INVENTION

1. Field of Invention

The present invention relates generally to an integrated circuit. More particularly, the present invention relates to a structure of a metal-oxide-semiconductor field effect transistor (MOSFET) and a fabrication method thereof.

2. Description of Related Art

For high-frequency applications of the MOSFET, e.g. radio frequency (RF) communication and high-speed analog and digital integrated circuits, effects of the internal parasitic capacitances of the MOSFET must be taken into account. Internal parasitic capacitances of the MOSFET include the gate-to-drain overlap capacitance, which arises because the drain region extends slightly under the gate electrode.

The effects of the internal capacitances are analyzed herein with reference to FIGS. 1A-1D. FIG. 1A illustrates the MOSFET common-source amplifier configuration. Three large-valued capacitors C1, C2, and C3 are used to couple the gate G, source S and drain D of a MOSFET Q to signal source Vi in s-domain, ground 100 and load resistance $R_L$, respectively. This amplifier has an output voltage Vo in s-domain. The signal generator generating the signal source Vi has a resistance Rs. A dc current source I is used to bias the MOSFET Q, and is connected to a negative supply voltage –Vss. A large resistor $R_G$ connects the gate G to ground 100, and a resistor $R_D$ connects the drain D to a positive supply voltage $V_{DD}$. It's assumed that the source S of the MOSFET Q is connected to the substrate, and in the following analysis of the high-frequency response of the MOSFET common-source amplifier of FIG. 1A these capacitors C1, C2, and C3 act as perfect short circuits.

FIG. 1B illustrates a small-signal equivalent circuit of the MOSFET common-source amplifier of FIG. 1A. In FIG. 1B, a small-signal equivalent circuit model for the MOSFET is used to replace the MOSFET Q of FIG. 1A. The small-signal equivalent circuit model includes the gate-to-source parasitic capacitance Cgs with a voltage Vgs across its two terminals, gate-to-drain parasitic capacitance Cgd, a dependent current source $g_m$Vgs, and an output resistance $r_o$, in which the MOSFET Q has a transconductance $g_m$. The parasitic capacitance between the drain D and source S (or substrate) is usually neglected in an approximate analysis.

In most situations of interest, the MOSFET operates in the saturation region. When the MOSFET Q is in the saturation region, the parasitic capacitance Cgs includes the gate-to-channel capacitance, the gate-to-source overlap capacitance and the gate-to-substrate parasitic capacitance. The gate-to-channel capacitance is the major component of the parasitic capacitance Cgs. The parasitic capacitance Cgd is entirely an overlap capacitance between the drain D and the gate G, and has a typical value of 1 to 10 fF (femto-Farad). As shown in FIG. 1B, the output resistance $r_o$, resistor $R_D$ and load resistance $R_L$ are combined to be an equivalent resistance $R'_L$.

FIG. 1C illustrates a simplified version of the small-signal equivalent circuit of FIG. 1B. A Thevenin voltage $ViR_G/(R_S+R_G)$ and a Thevenin resistance R' (equal to $R_S$ in parallel with $R_G$) are obtained by applying Thevenin's theorem at the input side of the circuit of FIG. 1B. Since the overlap capacitance Cgd is small, the current through it is very small and thus can be neglected in determining the output voltage Vo. Therefore, the output voltage Vo can be expressed as $$Vo \approx -g_m VgsR'_L$$

FIG. 1D illustrates the input (gate) side circuit of FIG. 1C after replacing the overlap capacitance Cgd with the equivalent Miller capacitance $C_M$ at the input side between the gate G and ground 100. Using the ratio of the voltages at the two sides of the overlap capacitance Cgd of FIG. 1C $$Vo/Vgs = -g_m R'_L$$

enables us to find the equivalent Miller capacitance $$C_M = Cgd(1+g_m R'_L)$$

With reference to FIG. 1D, the parasitic capacitance Cgs and the equivalent Miller capacitance $C_M$ are in parallel, so they can be combined to be an equivalent capacitance $C_T$. The input side circuit in FIG. 1D, an input RC circuit, is a circuit of a first-order low-pass filter whose time constant is $C_T R'$. This first-order circuit determines the high-frequency response of the common-source amplifier of FIG. 1A, introducing a dominant high-frequency pole. The dominant high-frequency pole represents the upper 3-dB frequency $\omega_H$ which is $$\omega_H = 1/C_T R'$$

Thus the high-frequency gain $A_H$ of the common-source amplifier can be expressed as $$A_H = A_M(1/[1+s/\omega_H])$$

where s is the complex frequency, and $A_H$ is the midband gain. The high-frequency response analysis described above can be found and is explained in more detail in "Microelectronic Circuits", International Thomson Publishing, 3 ed, chapter 7, by Adel S. Sedra and Kenneth C. Smith.

According to the above analysis, the overlap capacitance Cgd plays an important role in determining the high-frequency response. The overlap capacitance Cgd affects the equivalent capacitance $C_T$, thereby affecting the upper 3-dB frequency $\omega_H$ and the high-frequency voltage gain $A_H$. This is the Miller effect. If the overlap capacitance Cgd is reduced, the upper 3-dB frequency $\omega_H$ and the high-frequency gain $A_H$ can be increased. On the other hand, since the parasitic capacitance Cgs is an important factor affecting the MOSFET device parameters, including the threshold voltage Vt and the drain-to-source current $I_{DS}$, and thus affecting device performance, the gate-to-source overlap capacitance shouldn't be reduced.

Accordingly, there is a need for a MOSFET fabricating method that can be used to reduce the gate-to-drain overlap capacitance Cgd, and thus to improve the high-frequency response of MOSFET amplifiers.

SUMMARY OF THE INVENTION

An objective of the present invention is to provide a method of fabricating a MOSFET device for reducing the gate-to-drain overlap capacitance, thus improving the high-frequency response of MOSFET amplifiers.

Another objective of the present invention is to provide a MOSFET structure for reducing the gate-to-drain overlap capacitance, thus improving the high-frequency response of MOSFET amplifiers.

According to an embodiment of the present invention, a method of fabricating a MOSFET device includes the following steps. First, a gate structure is formed on a substrate. The gate structure comprises a gate dielectric layer and a conductive layer. A masking layer is then formed to cover the gate structure and the substrate. Next, the masking layer is etched to expose a side of the gate structure and a region of a surface of the substrate adjacent to the side. Next, an oxidation process is performed on part of the exposed side of the gate structure, such that a bottom corner of the exposed gate structure is oxidized to form a bird's beak structure. The masking layer is then removed. Finally, a source region and a drain region are formed in the substrate respectively adjacent to two sides of the gate structure. The drain region is adjacent to the bird's beak structure and the exposed side.

According to another embodiment of the present invention, a method of fabricating a MOSFET device includes the following steps. First, a gate structure is formed on a substrate. The gate structure comprises a gate dielectric layer and a conductive layer. A masking layer is then formed to cover the gate structure and the substrate. Next, implant ions are directed onto the masking layer at an angle so as to shield part of the masking layer against the ions. Next, the masking layer is selectively etched so as to expose a side of the gate structure and a region of a surface of the substrate adjacent to the side. An oxidation process is then performed on part of the exposed side of the gate structure, such that a bottom corner of the exposed gate structure is oxidized to form a bird's beak structure. The masking layer is then removed. Finally, a source region and a drain region are formed in the substrate respectively adjacent to two sides of the gate structure. The drain region is adjacent to the bird's beak structure and the exposed side.

According to an objective of the present invention, a MOSFET structure is described as follows. A gate dielectric layer is located on a substrate, and a gate is located on the gate dielectric layer. There are a source region and a drain region in the substrate, adjacent to the gate, respectively. A portion of the gate dielectric layer adjacent to the drain region has a bird's beak structure, so as to reduce the gate-to-drain overlap capacitance between the gate and the drain region.

Advantages of the present invention include the following. Since a portion of the gate dielectric layer adjacent to the drain region is a bird's beak structure, the gate-to-drain overlap capacitance is reduced. Because a bird's beak structure is not present at the overlap portion between the gate and the source region, after forming the bird's beak structure adjacent to the drain region, the threshold voltage and the drain-to-source current are not significantly affected. In conclusion, after the gate-to-drain overlap capacitance is reduced by the presence of the bird's beak structure, no significant change occurs in the dc and low-frequency operation performance of the MOSFET, whereas the high-frequency operation performance of the MOSFET is much improved.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1A:
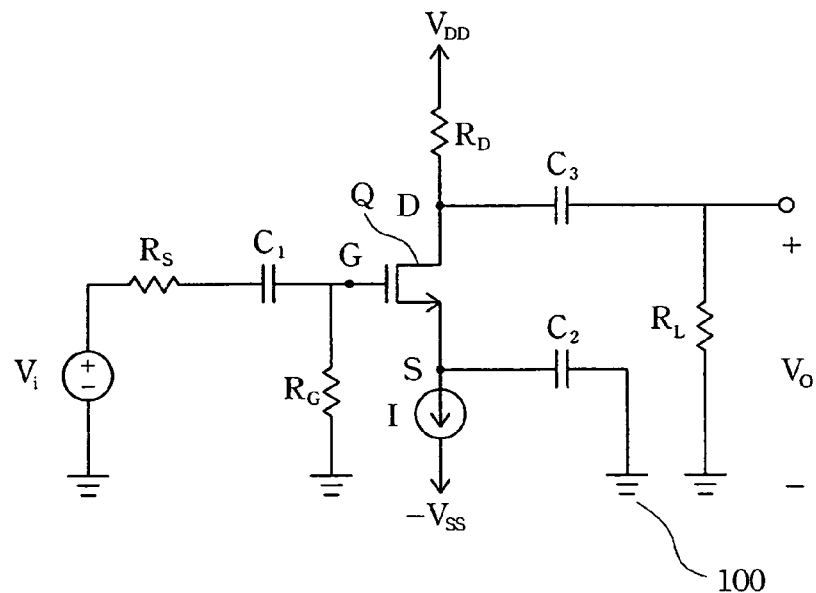
FIG. 1A illustrates the MOSFET common-source amplifier configuration.
Figure 1B:
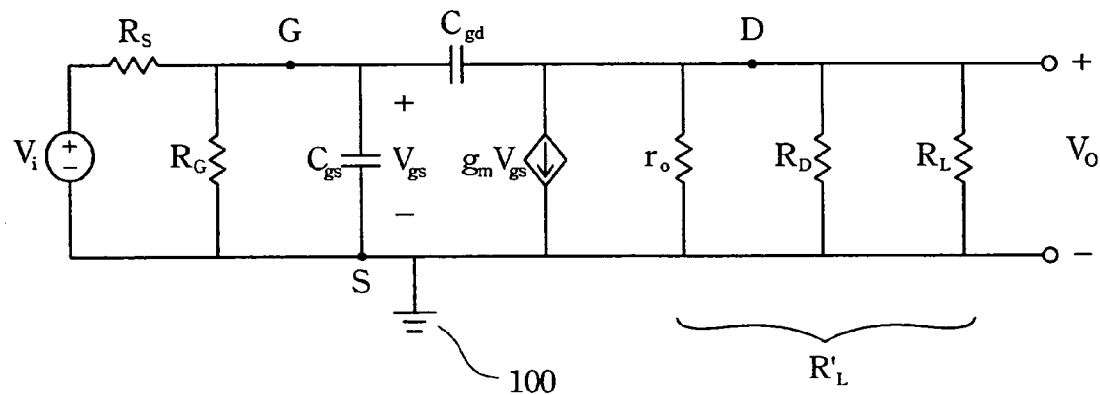
FIG. 1B illustrates a small-signal equivalent circuit of the MOSFET common-source amplifier of FIG. 1A.
Figure 1C:
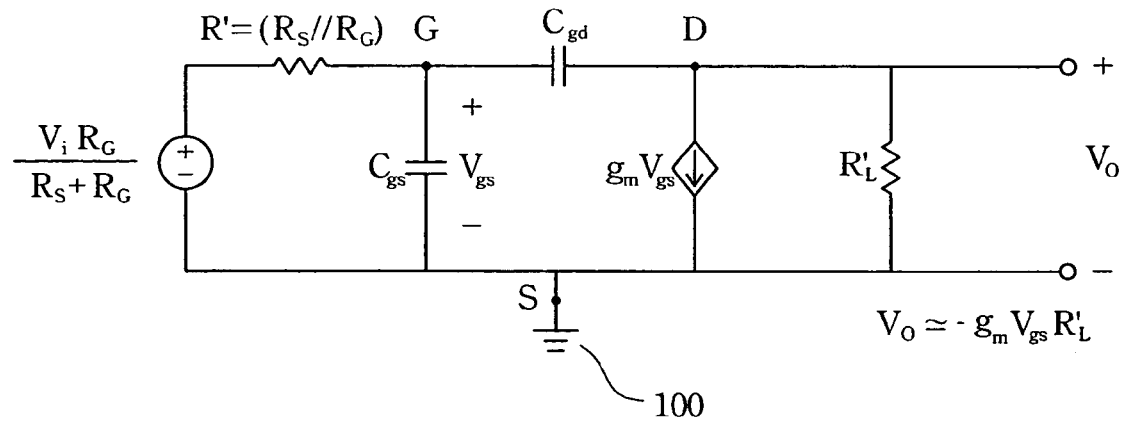
FIG. 1C illustrates a simplified version of the small-signal equivalent circuit of FIG. 1B.
Figure 1D:
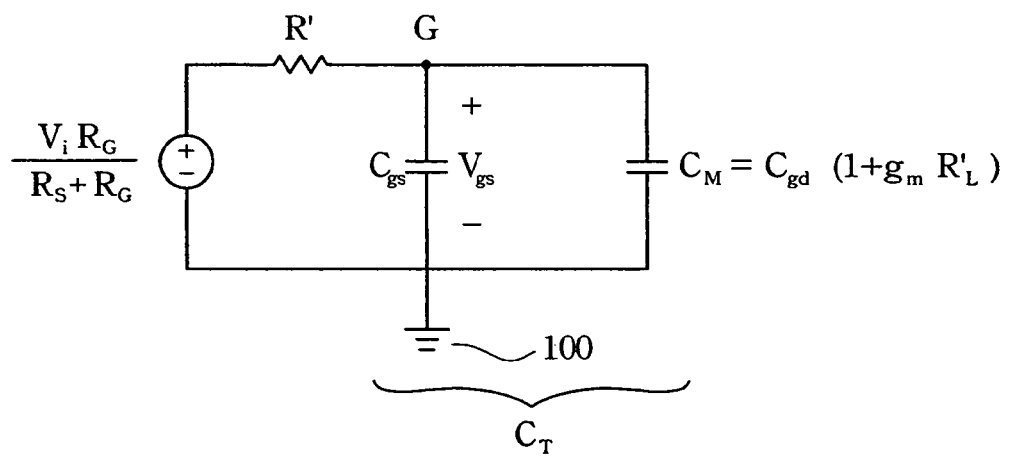
FIG. 1D illustrates the input side circuit of FIG. 1C after replacing the overlap capacitance Cgd with the equivalent Miller capacitance $C_M$ at the input side between the gate G and ground 100.

References will now be made to the preferred embodiments of the present invention. Wherever possible, the same reference numbers are used in the drawings and the description to refer to the same or substantially similar elements.

Figure 2:
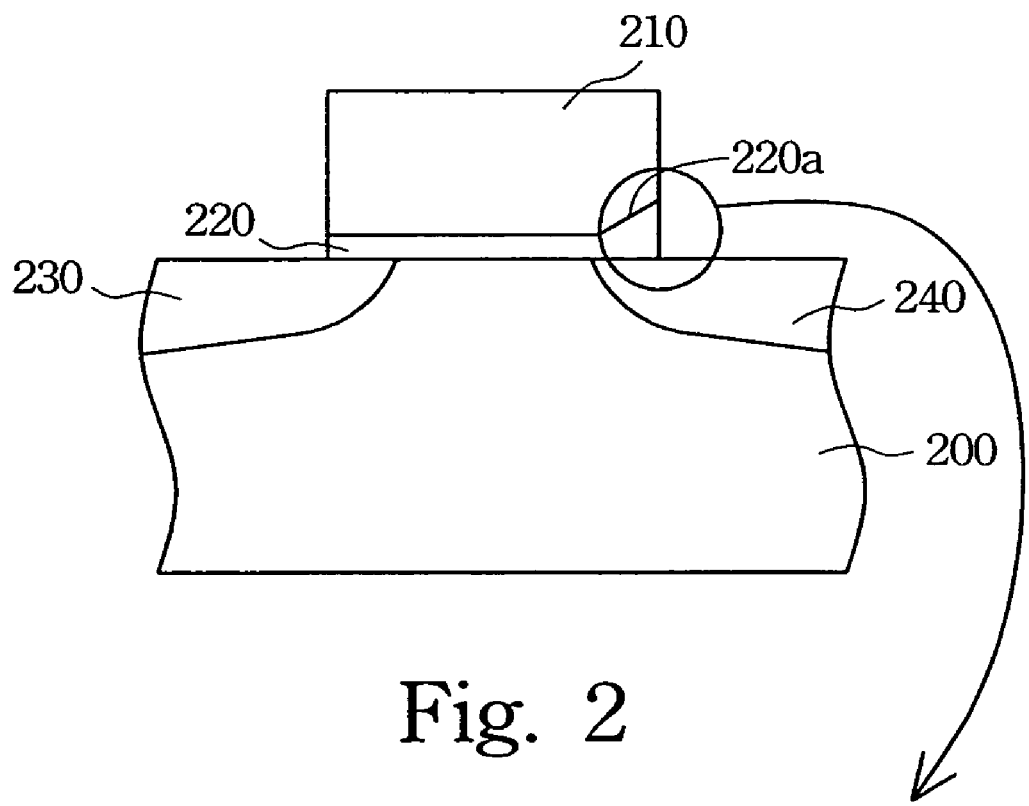
FIG. 2 illustrates a cross section of a MOSFET structure according to an embodiment of the invention.

FIG. 2 illustrates a cross section of a MOSFET structure according to an embodiment of the invention. A gate dielectric layer 220 and a gate 210 are located on a substrate 200. There are a source region 230 and a drain region 240 in the substrate 200, both of which are adjacent to and partially extend under the gate 210. A portion of the gate dielectric layer 220 adjacent to the drain region 240 has a bird's beak structure 220a with increased thickness, so as to reduce the gate-to-drain overlap capacitance between the gate 210 and the drain region 240.

Analytic Calculation of the Overlap Capacitance Value

The following device characteristics, dimensions and values are assumed for the purpose of the analytic calculation of the gate-to-drain overlap capacitance. The MOSFET structure in FIG. 2 is an N-channel MOSFET. The material of the gate dielectric layer 220 is for instance silicon dioxide and the thickness thereof is 40 angstroms. The channel length of this N-channel MOSFET is 0.2 micrometers (μm). When the bird's beak structure 220a with increased thickness is not present, and this portion is the same as the portion of the gate dielectric layer 220 on the other side of the gate 210 adjacent to the source region 230, the overlap capacitance between the gate 210 and the drain region 240 is 1.328 fF. When the bird's beak structure 220a with increased thickness is present, the calculation of the overlap capacitance between the gate 210 and the drain region 240 is as follows.

Figure 3:
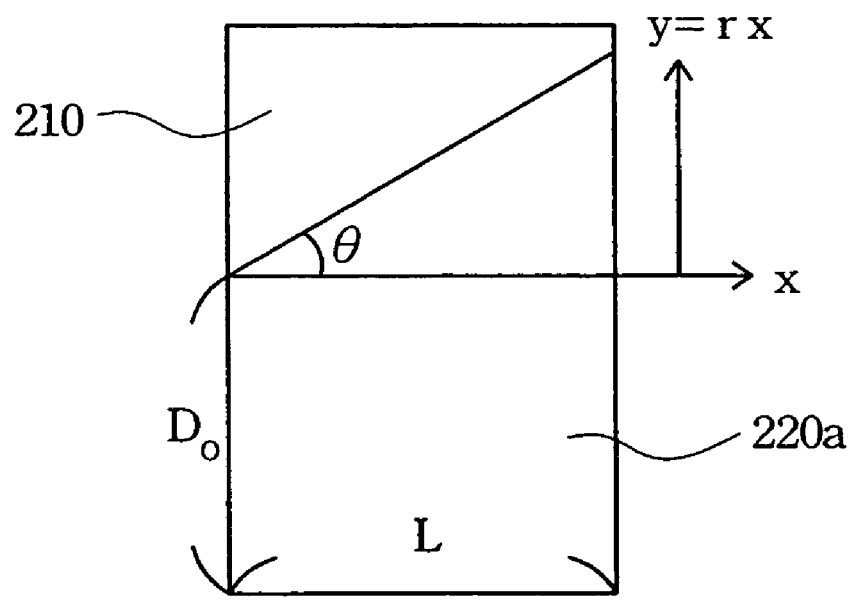
FIG. 3 is an enlarged illustration of the bird's beak structure 220a of FIG. 2.

FIG. 3 is an enlarged illustration of the bird's beak structure 220a of FIG. 2. Referring to FIG. 3, the thickness $D_0$ of the gate dielectric layer 220 except the bird's beak structure 220a is equal to 40 angstroms. The angle θ between the oblique side of the bird's beak structure 220a and the horizontal is 30°. The channel width W (not shown) of this N-channel MOSFET is equal to 10 micrometers, and the length L of the bird's beak structure 220a along the direction of the channel is equal to 0.06 micrometers. The starting point of the oblique side of the bird's beak structure 220a is regarded as the origin of a rectangular coordinate system formed by an x-axis and a y-axis. Any point on the oblique side of the bird's beak structure 220a has a height y, which is equal to the slope r of the oblique side times the x value of the point. The slope r of the oblique side of the bird's beak structure 220a is expressed in equation (1).

$$r = \tan \theta \quad (1)$$

According to the definition of a capacitor formed by two parallel conductive plates separated by a dielectric medium, the overlap capacitance C between the gate 210 and the drain region 240 is equal to the stored charge ΔQ in the dielectric medium divided by the electric potential difference ΔV between the two parallel plates, and is also equal to the dielectric constant ∈ of the dielectric medium times the area A of the two parallel plates, and further divided by the distance D between the two parallel plates, as shown in equation (2).

$$C = \frac{\Delta Q}{\Delta V} = \frac{\varepsilon A}{D} \quad (2)$$

Therefore, the formula for the overlap capacitance C between the gate 210 and the drain region 240 is a definite integration of equation (2), as shown in equation (3). In this case, A is equal to Wdx, D is equal to $D_0+rx$, and x is from 0 to L.

$$\begin{aligned} C &= \varepsilon W \int \frac{1}{D_0 + rx} dx \\ &= \varepsilon \frac{W}{r} \int_0^L \frac{1}{(D_0/r + x)} dx \\ &= \varepsilon \frac{W}{r} \ln(D_0/r + x) \Big|_0^L \\ &= \varepsilon \frac{W}{r} \ln\left(\frac{D_0 + L*r}{D_0}\right) \end{aligned} \quad (3)$$

Using the numerical values of all variables and constants in equation (3), the value of the overlap capacitance C between the gate 210 and the drain region 240 can be found to be about 0.348 fF. According to the calculation and analysis, it can be seen that after forming the bird's beak structure 220a, the overlap capacitance C between the gate 210 and the drain region 240 is reduced by about 74% of the original value 1.328 fF.

First Embodiment

Figure 4A:
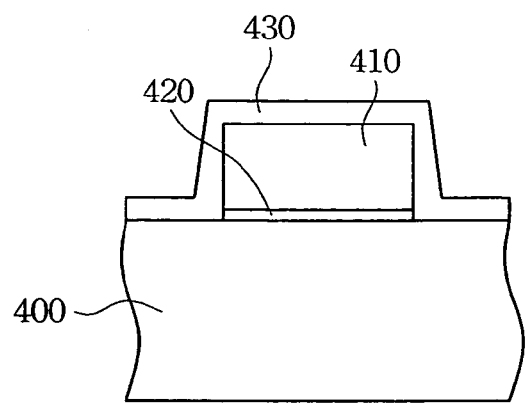
FIGS. 4A-4E illustrate cross sections of a fabrication process of a MOSFET structure according to a preferred embodiment of the invention.

FIGS. 4A-4E illustrate cross sections of a fabrication process of a MOSFET structure according to a preferred embodiment of the invention. With reference to FIG. 4A, a dielectric layer and a conductive layer are first sequentially formed on a P-type substrate 400. The material of the dielectric layer is, for example, oxide, and preferably is silicon dioxide. The dielectric layer is formed by, for example, thermal oxidation. The material of the conductive layer is, for example, polysilicon, and the conductive layer is formed by, for example, chemical vapor deposition (CVD). A photolithography and etching process is then performed on the dielectric layer and the conductive layer to define a gate 410 and a gate dielectric layer 420. The gate 410 is a portion of the conductive layer, and the gate dielectric layer 420 is a portion of the dielectric layer. The gate 410 and the gate dielectric layer 420 can be collectively called a gate structure. Next, a masking layer 430 is formed to cover the gate structure and the substrate 400. The material of the masking layer 430 is, for example, nitride, and preferably is silicon nitride. The masking layer 430 is formed by, for example, CVD.

Figure 4B:
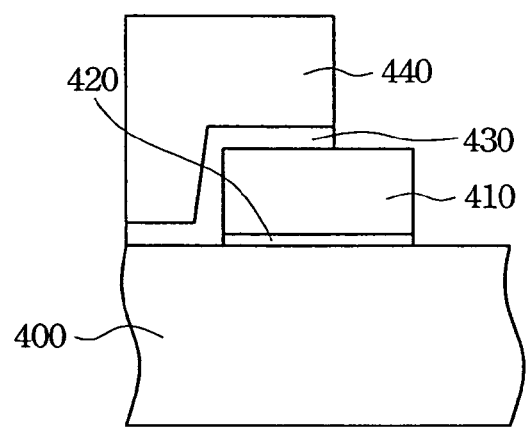
Figure 4C:
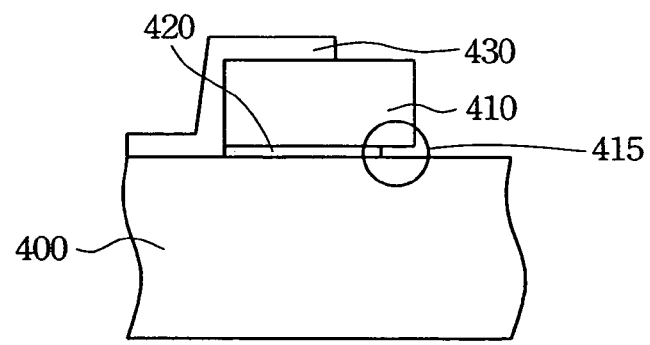

With reference to FIG. 4B, a photoresist layer 440 is then used to partially cover the masking layer 430, and the rest of the masking layer 430 not covered by the photoresist layer 440 is etched to expose a side of the gate structure and a region of a surface of the substrate 400 adjacent to the side. If the material of the masking layer 430 is silicon nitride, a solution comprising phosphoric acid, for example, can be used to selectively etch (remove) part of the masking layer 430. With reference to FIG. 4C, the photoresist layer 440 is then removed, and an etching is performed using, for example, a solution comprising hydrofluoric acid (HF) to laterally etch part of the gate dielectric layer 420 on the exposed side, in order to expose a bottom corner 415 of the gate structure. The lateral etching is, for example, an isotropic etching.

Figure 4D:
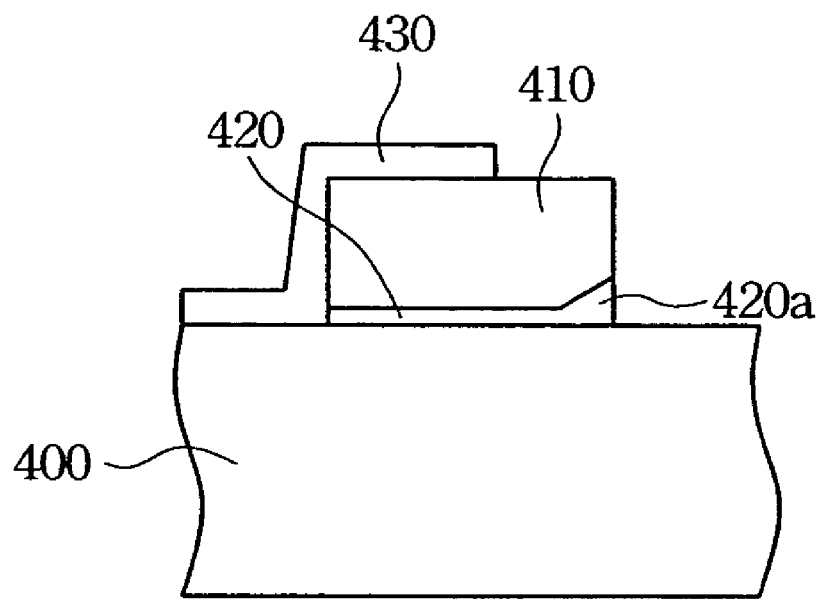

With reference to FIG. 4D, an oxidation process is then performed on part of the exposed side of the gate structure, such that the bottom corner 415 of the gate structure is oxidized to form a bird's beak structure 420a. This oxidation process is, for example, a thermal oxidation. The oxide on the surface of the exposed substrate 400 and the gate 410 resulting from the oxidation process is then removed, thus completing the structure shown in FIG. 4D.

Figure 4E:
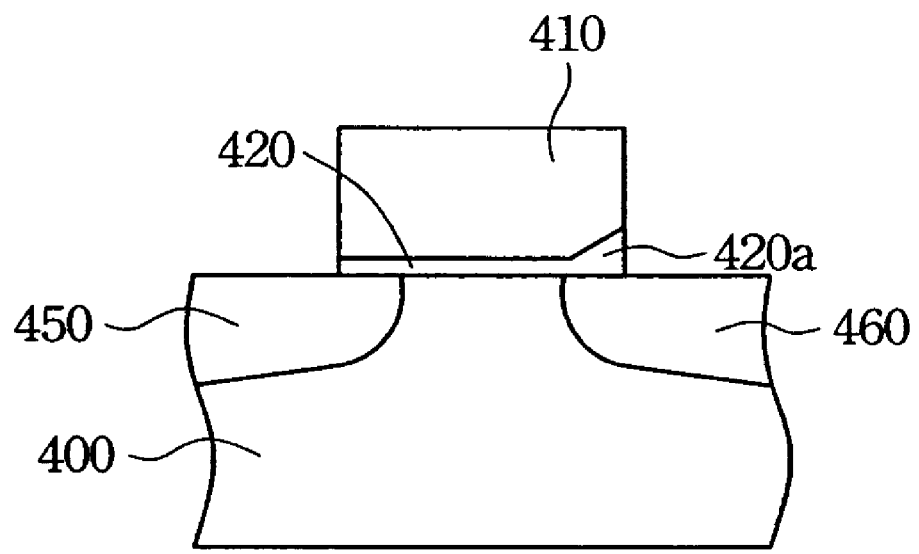

With reference to FIG. 4E, the masking layer 430 is then removed, and an N-type source region 450 and an N-type drain region 460 are formed in the substrate 400, which are respectively adjacent to two sides of the gate structure. The source region 450 and the drain region 460 are formed by, for example, ion implantation, and the drain region 460 is adjacent to the bird's beak structure 420a and the exposed side. The N-channel MOSFET structure is now completed, as shown in FIG. 4E.

The function of the bird's beak structure 420a is to reduce the overlap capacitance between the gate 410 and the drain region 460. It should be understood that the step of laterally etching part of the gate dielectric layer 420 described above might alternatively be omitted. Performing this lateral etching can help control the shape of the bird's beak structure 420a formed.

In this embodiment, the channel length of the N-channel MOSFET structure is 0.2 micrometers, and the thickness of the gate dielectric layer 420 except the bird's beak structure 420a is 40 angstroms. The original unit length gate-to-drain overlap capacitance value before forming the bird's beak structure 420a is 0.451 fF/μm, whereas after forming the bird's beak structure 420a the unit length overlap capacitance value between the gate 410 and the drain region 460 becomes 0.307 fF/μm. Therefore, the unit length overlap capacitance value is reduced by about 32%. At the same time, the threshold voltage Vt and the drain-to-source current $I_{DS}$ do not shift much, and each still remains in a respective range of ideal values. The threshold voltage Vt shifts by about 20 millivolts (mV). In addition, some other implantation processes can be performed to help maintain ideal device characteristics.

Second Embodiment

Figure 5A:
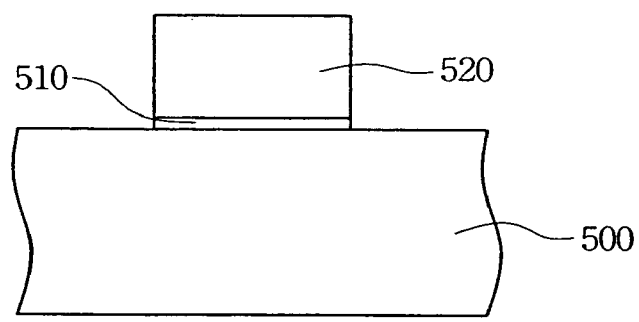
FIGS. 5A-5F illustrate cross sections of a fabrication process of a MOSFET structure according to another preferred embodiment of the invention.

FIGS. 5A-5F illustrate cross sections of a fabrication process of a MOSFET structure according to another preferred embodiment of the invention. With reference to FIG. 5A, a dielectric layer and a conductive layer are first sequentially formed on a P-type substrate 500. The material of the dielectric layer is, for example, oxide, and preferably is silicon dioxide. The dielectric layer is formed by, for example, thermal oxidation. The material of the conductive layer is, for example, polysilicon, and the conductive layer is formed by, for example, CVD. A photolithography and etching process is then performed on the dielectric layer and the conductive layer to define a gate 520 and a gate dielectric layer 510. The gate 520 is a portion of the conductive layer, and the gate dielectric layer 510 is a portion of the dielectric layer. The gate 520 and the gate dielectric layer 510 can be collectively called a gate structure.

Figure 5B:
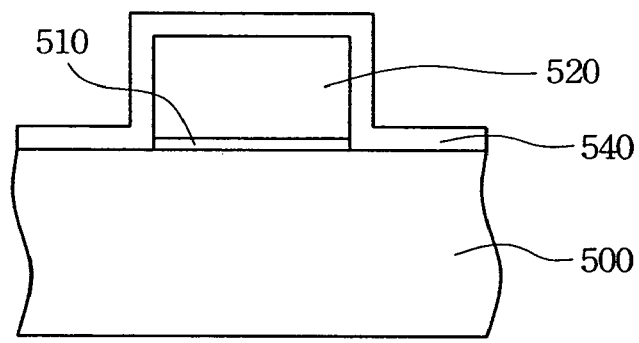
Figure 5C:
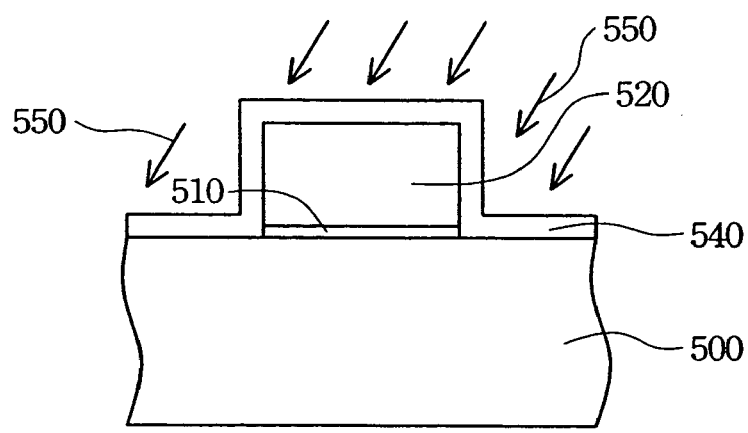

With reference to FIG. 5B, a masking layer 540 is then formed to cover the gate structure and the substrate 500. The material of the masking layer 540 is, for example, oxide, and the masking layer 540 is formed by, for example, CVD. With reference to FIG. 5C, an ion implantation 550 is then performed, in which implant ions are directed onto the masking layer 540 at an angle and the shadow effect of the gate 520 is utilized, so as to shield part of the masking layer 540 against the ions. The ion source used in the ion implantation 550 is, for example, nitrogen, argon or other heavy ions.

Figure 5D:
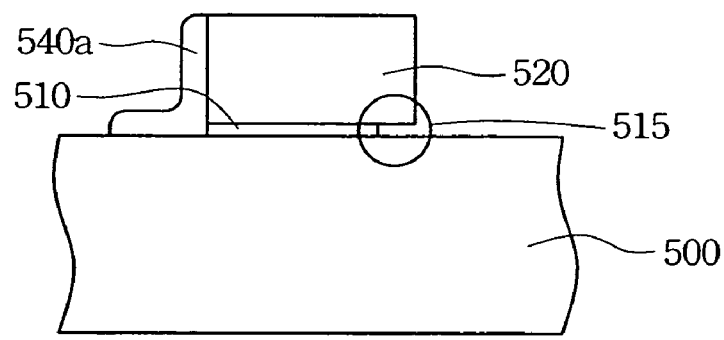

With reference to FIG. 5D, a selective etching, e.g. a wet etching, is then performed to remove part of the masking layer 540 with implanted ions, so as to expose a side of the gate structure and a region of a surface of the substrate 500 adjacent to the side. If the material of the masking layer 540 is silicon dioxide, a solution comprising hydrofluoric acid, for example, can be used to perform the selective etching, in which the etching rate of silicon dioxide containing implanted ions is faster than that of silicon dioxide without implanted ions. Upon completing the selective etching, a portion 540a of the masking layer 540 without implanted ions remains. Next, an etching is performed using, for example, a solution comprising hydrofluoric acid to etch laterally part of the gate dielectric layer 510 on the exposed side, in order to expose a bottom corner 515 of the gate structure. The lateral etching is, for example, an isotropic etching.

Figure 5E:
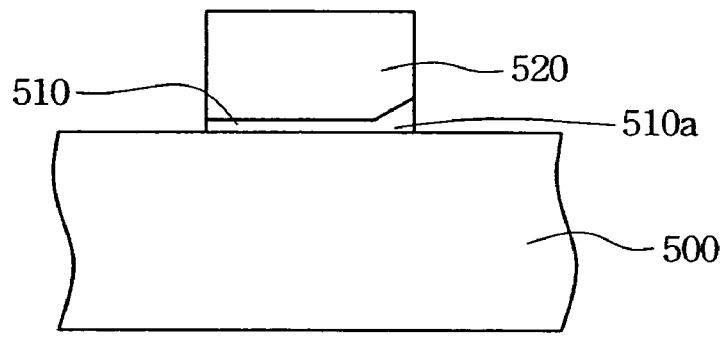

With reference to FIG. 5E, an oxidation process is then performed on part of the exposed side of the gate structure, such that the bottom corner 515 of the gate structure is oxidized to form a bird's beak structure 510a. This oxidation process is, for example, a thermal oxidation. The remaining portion 540a of the masking layer 540, and the oxide on the surface of the exposed part of the substrate 500 and the gate 520 resulting from the oxidation process are then removed, thus completing the structure shown in FIG. 5E.

Figure 5F:
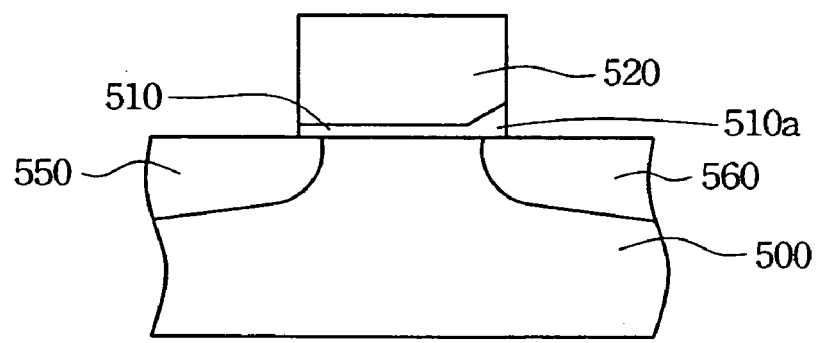

With reference to FIG. 5F, an N-type source region 550 and an N-type drain region 560 are then formed in the substrate 500, which are respectively adjacent to two sides of the gate structure. The source region 550 and the drain region 560 are formed by, for example, ion implantation, and the drain region 560 is adjacent to the bird's beak structure 510a and the exposed side. The N-channel MOSFET structure is now completed, as shown in FIG. 5F.

The function of the bird's beak structure 510a is to reduce the overlap capacitance between the gate 520 and the drain region 560. It should be understood that the step of laterally etching part of the gate dielectric layer 510 described above might alternatively be omitted. Performing this lateral etching can help control the shape of the bird's beak structure 510a formed.

If the P-type substrates 400 and 500 in the two embodiments described above are replaced by N-type materials, and the source regions 450 and 550 and the drain regions 460 and 560 are all P-type regions, a P-channel MOSFET structure can be made.

According to the preferred embodiments of the invention, advantages of the present invention include the following. Since a portion of the gate dielectric layer adjacent to the drain region is a bird's beak structure, the gate-to-drain overlap capacitance is reduced. Because a bird's beak structure is not present at the overlap portion between the gate and the source region, after forming the bird's beak structure adjacent to the drain region the threshold voltage Vt and the drain-to-source current $I_{DS}$ are not significantly affected. In conclusion, after the gate-to-drain overlap capacitance is reduced by the presence of the bird's beak structure, no significant change occurs in the dc and low-frequency operation performance of the MOSFET, whereas the high-frequency operation performance of the MOSFET is much improved.

It will be apparent to those skilled in the art that various modifications and variations can be made to the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a MOSFET device, comprising:
    forming a gate structure on a substrate, said gate structure comprising a gate dielectric layer and a conductive layer;
    forming a masking layer to cover said gate structure and the substrate;
    directing implant ions onto said masking layer at an angle so as to shield part of said masking layer against the ions;
    selectively etching the ion implanted part of said masking layer so as to expose a side of said gate structure and a region of a surface of the substrate adjacent to the side;
    performing an oxidation process on part of the exposed side of said gate structure, such that a bottom corner of the exposed gate structure is oxidized to form a bird's beak structure;
    removing said masking layer; and
    forming a source region and a drain region in the substrate respectively adjacent to two sides of said gate structure, wherein said drain region is adjacent to said bird's beak structure and the exposed side.

2. The method of claim 1, wherein said conductive layer comprises a polysilicon layer.

3. The method of claim 1, wherein said gate dielectric layer comprises an oxide layer.

4. The method of claim 1, wherein said masking layer comprises an oxide layer.

5. The method of claim 4, wherein forming said masking layer is performed by chemical vapor deposition.

6. The method of claim 1, wherein the selective etching comprises a wet etching process.

7. The method of claim 1, wherein said masking layer comprises a silicon dioxide layer.

8. The method of claim 7, wherein the selective etching comprises utilizing a solution comprising HF.

9. The method of claim 1, wherein the implanted ions comprise one of nitrogen ions and argon ions.

10. The method of claim 1, further comprising laterally etching part of said gate dielectric layer on the exposed side before performing said oxidation process.

11. The method of claim 10, wherein the lateral etching step is performed by isotropic etching.

* * * * *